(12) United States Patent
Patel et al.

(10) Patent No.: US 6,515,507 B1
(45) Date of Patent: Feb. 4, 2003

(54) CONTROL PIN FOR SPECIFYING INTEGRATED CIRCUIT VOLTAGE LEVELS

(75) Inventors: Rakesh H. Patel, Cupertino, CA (US); Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/607,569

(22) Filed: Jun. 29, 2000

Related U.S. Application Data
(60) Provisional application No. 60/142,180, filed on Jul. 1, 1999.

(51) Int. Cl.[7] .................................................. G06F 7/38
(52) U.S. Cl. ........................ 326/38; 326/80; 365/185.21
(58) Field of Search ............................... 326/38, 40, 80, 326/81; 365/201, 185.21, 228, 226

(56) References Cited

U.S. PATENT DOCUMENTS

| | | | |
|---|---|---|---|
| 5,943,262 A | * 8/1999 | Roohparvar | ........... 365/185.15 |
| 5,956,277 A | * 9/1999 | Roohparvar | ................ 365/201 |
| 6,025,737 A | 2/2000 | Patel et al. | |
| 6,040,708 A | * 3/2000 | Blake et al. | .................. 326/33 |

* cited by examiner

*Primary Examiner*—Daniel Chang
(74) *Attorney, Agent, or Firm*—Townsend and Townsend and Crew LLP

(57) ABSTRACT

An integrated circuit has one or more external control pins to control and indicate which of two or more different VCC or other voltage levels will be used. The control pin receives a logic signal, high or low, and draws zero static power. A user can use the integrated circuit with two or more VCC voltage levels by indicating which voltage level at the control pins. In a specific embodiment, the integrated circuit has nonvolatile memory cells such as EEPROM or Flash cells that a configurable and reconfigurable using on-chip programming circuitry. The programming circuitry may generate and use superhigh or high voltages, higher than the VCC voltage.

41 Claims, 6 Drawing Sheets

CONTROL PIN FOR SPECIFYING INTEGRATED CIRCUIT VOLTAGE LEVELS

This application claims the benefit of U.S. provisional application No. 60/142,180, filed Jul. 1, 1999, which is incorporated by reference.

BACKGROUND OF THE INVENTION

The present invention relates to integrated circuits capable of being used with different VCC voltage levels, and in particular to a technique of using control pins to specify the VCC or other voltage levels.

As integrated circuit and processing technology continue to evolve, the VCC and other voltage levels of the integrated circuit continue to change. Typically, VCC supply voltages are being reduced. For example, some supply voltages in use today are 5 volts, 3.3 volts, 3 volts, 2.5 volts, and 1.8 volts. Generally, integrated circuits have been designed to be used with a particular supply voltage, and not other supply voltages. This means that the integrated circuit manufacturer needs to fabricate different version of the integrated circuit for the different supply voltages. And, the customer or user needs to order and stock different versions of the same integrated circuit for the different supply voltages.

It is desirable that the same integrated circuit design can be configured to be used with multiple voltage supply voltage levels. And, it is desirable that the user can selectively configure the integrated circuit device to operate with the voltage level the user selects.

As can be appreciated, there is a need for improved techniques and circuitry for providing and integrated circuit capable of operating using multiple supply voltage levels.

SUMMARY OF THE INVENTION

The present invention provides circuitry and techniques for an integrated circuit capable of operating with multiple, different voltage levels. The integrated circuit has one or more external control pins to indicate which VCC or other voltage level will be used with the chip. The control pin receives a logic signal, high or low, and draws zero static power. A user can use the integrated circuit with two or more VCC voltage levels by indicating which voltage level at the control pins. In a specific embodiment, the integrated circuit has nonvolatile memory cells such as EEPROM or Flash cells that a configurable and reconfigurable using on-chip programming circuitry. The programming circuitry may generate and use superhigh or high voltages, higher than the VCC voltage. In a specific embodiment, the invention is an integrated circuit including an external pin; a voltage level detect circuit connected to the external pins, where the voltage level detect circuit outputs a logic signal indicative of a voltage supply level provided to the integrated circuit by a user; and an internal circuit connected to receive the logic signal, where the internal circuit modifies its operation based on the logic signal in order to operate at the user's voltage supply level. Further, the voltage supply level may be VCC or VDD. Alternatively, the voltage supply level may be VPP. For the integrated circuit, when the voltage supply level is 5 volts, the external pin is connected to ground, and when the voltage supply level is 3 volts, the external pin is connected to the voltage supply level. The voltage level detect circuit may include a logic gate to decode data input at the external pin. The integrated circuit may be a programmable logic integrated circuit. In an embodiment, the external pin is connected only to the voltage level detect circuit of the integrated circuit. The external pin may supply zero current to the integrated circuit. The external pin receives a logic signal. In another embodiment, the external pin supplies less than one milliamp to the integrated circuit. The external pin does not supply the voltage supply level to the internal circuit.

In another embodiment, the invention is a programmable integrated circuit including a VCC level control pin and a number of input buffers, each connected to the VCC level control pin. There are a number of memory cells connected to the input buffer. A number of sense amplifiers are connected to the memory cells and the VCC level control pin, where the input buffers and sense amplifiers are configured to operate with one of at least two different VCC voltage levels based on a logic level at the VCC level control pin.

An input buffer includes a first buffer. The first buffer includes a first transistor connected to a VCC supply and a second transistor connected between the first transistor and a first buffer output node. A third transistor is connected between the first buffer output node and a ground supply, where control electrodes of the second and third transistors are connected to an input pin and sizes of the second to third transistors have a first ratio. A second buffer of the input buffer includes a fourth transistor connected to the VCC supply and a fifth transistor connected between the fourth transistor and a second buffer output node. A sixth transistor is connected between the second buffer output node and the ground supply, where control electrodes of the fifth and sixth transistors are connected to an input pin and sizes of the fifth and sixth transistors have a second ratio, different from the first ratio. A logic gate circuit of the input buffer is connected to the first and second buffer outputs and providing an input buffer output, where a control electrode of the first transistor is connected to a signal from the VCC level control pin and a control electrode of the fourth transistor is connected to an inverted version of the signal from the VCC level control pin.

A sense amplifier includes a bit line having a plurality of memory cells connected in parallel. A first pull-up transistor is connected to the bit line and has a first size. A second pull-up transistor is connected to the bit line and has a second size, different from the first size, where a control electrode of the first pull-up transistor is connected to a signal from the VCC level control pin and a control electrode of the second pull-up transistor is connected to an inverted version of the signal from the VCC level control pin.

The programming circuitry includes an oscillator circuit having a first oscillator having a first oscillator frequency and a second oscillator having a second oscillator frequency, different from the first oscillator frequency. A first logic gate is connected to the first oscillator and a signal from the VCC level control pin. A second logic gate connected to the second oscillator and an inverted version of the signal from the VCC level control pin. A third logic gate is connected to the first and second logic gates and provides an oscillator output.

A superhigh voltage detector circuit includes a first impedance divider circuit having a first ratio, connected to the superhigh voltage pin. A second impedance divider circuit has a second ratio, different from the first ratio, and is connected to the superhigh voltage pin. A multiplexer circuit is connected to the first and second impedance divider circuits, where a selection input of the multiplexer is connected to the VCC level control pin and the multiplexer outputs a superhigh voltage control signal.

In another embodiment, the invention is a programmable logic integrated circuit including a VCC level control pin, a plurality of input buffers, each having an adjustable input threshold voltage which is varied based on the VCC level control pin. A plurality of memory cells are connected to the input buffers. A plurality of sense amplifiers are connected to the memory, cells where each sense amplifier has an adjustable trip point which is varied based on the VCC level control pin. A plurality of configurable logic circuits, connected to the sense amplifiers, are programmable by a user to implement logical functions. Programming circuitry is connected to the sense memory cells including an oscillator circuit having an adjustable oscillator frequency which is varied based on the VCC level control pin.

Other objects, features, and advantages of the present invention will become apparent upon consideration of the following detailed description and the accompanying drawings, in which like reference designations represent like features throughout the figures.

DETAILED DESCRIPTION

Programmable logic integrated circuits and other types of integrated circuits often can operate with a number of supply voltages. Programmable logic integrated circuits include programmable logic devices (PLDs), field programmable gate arrays (FPGAs), and the like. The Altera 1999 Databook describes programmable logic integrated circuits in some detail and is incorporated by reference.

Integrated circuits are used in a number of environments and with different supply voltages (VCC or VDD). For example, some commonly used supply voltages are 5 volts, 3.3 volts, 3 volts, and 2.5 volts. Generally, supply voltages are being reduced in order to help facilitate higher performance integrated circuit technology. Therefore, even lower supply voltages are expected in the future.

It is desirable that an integrated circuit will be compatible with the different supply voltages. Some techniques of making an integrated circuit compatible with various supply voltages are discussed in U.S. patent applications Ser. Nos. 08/863,886, 08/863,879, 08/863,876, and 08/863,905, which are incorporated by reference.

Some of the circuitry on the integrated circuit may be sensitive to the level of the supply voltage. For example, such circuitry may include the programming circuitry for programming Flash, EEPROM, or EPROM nonvolatile memory cells or the sense amplifier circuitry used to read the memory cells. Therefore, the operation of the on-chip circuitry may need to be adjusted or altered to be more efficient or effective at the particular level of the supply voltage. For some circuitry, if the supply voltage level is not known, the circuitry may provide an incorrect functional result.

Techniques are needed so that the integrated circuit will be "aware" of the level of the supply voltage. One technique is to use a laser fuse. The laser fuse (or fuses) is programmed to indicate the level of the supply. For example, if the fuse is blown, the level will be 3 volts. And if the fuse is not blown, the level will be 5 volts. Other techniques include using EEPROM, EPROM, or Flash transistors; these memory cells would be programmed or configured to reflect the supply voltage level. Another technique involves using bonding wires; certain bonding wires are bonded to specific voltages or pads to reflect the supply voltage level.

There is, however, a problem when using a Flash memory cell to store the supply voltage level. Without prior knowledge of the supply voltage level, depending on the process technology and circuitry, it may be difficult to reliably determine what data is stored in the Flash cell.

Figure 1:
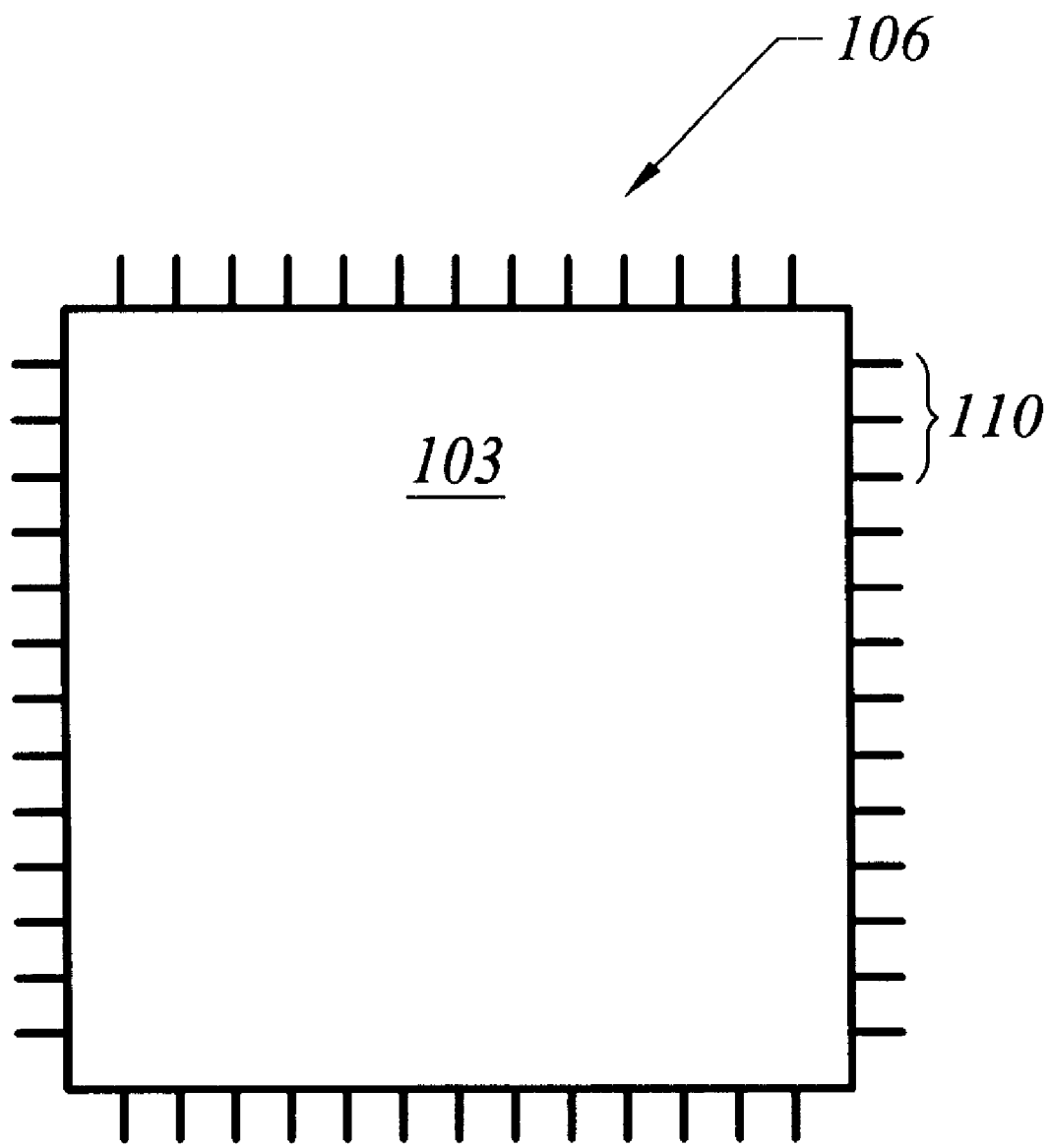
FIG. 1 shows an integrated circuit with external control input pins to indicate the voltage level.

Therefore, another technique to indicate the supply voltage level or VCC level is by using one or more extra pins on the package. FIG. 1 shows an integrated circuit 103 with pins 106. These pins are typically used for input and output or I/O. There are one or more additional pins 110 that will be used to indicate the voltage level of the supply. By using these pins, a user can tell the chip what the operating range is. There is no need to add fuses or Flash devices to the integrated circuit for this purpose.

The extra pin or pins may be used as follows. The user can bond the pin to the power plane or ground plane. For example, if the power supply is 3 volts, the pin would be bonded to the power supply. While if the power supply is 5 volts, the pin would then be bonded to ground. Of course, the scheme can be exactly the opposite convention as well. If multiple pins are used, then a binary decoding scheme can be used too. With two pins, four different supply voltages can be distinguished. For the binary scheme, the equation m=2P gives the maximum number of different supply voltage levels m for the number of pins P. There may be on-chip circuitry to decode or buffer the external pins. This circuitry may include logic gates such as NAND, NOR, AND, OR, NOT, and XOR.

This scheme of the invention can also be used to distinguish voltage levels other than the VCC supply voltage. For example, another voltage level is the VPP or programming voltage level. VPP is typically the voltage input to the chip for configuring the nonvolatile memory cells. With external pins, the user can tell the integrated circuit what the VPP level is, whether it is, for example, 7 volts, 9 volts, 9.6 volts, or 13 volts.

In a specific embodiment, the invention is an integrated circuit including an external pin; a voltage level detect circuit connected to the external pins, where the voltage level detect circuit outputs a logic signal indicative of a voltage supply level provided to the integrated circuit by a user; and an internal circuit connected to receive the logic signal, where the internal circuit modifies its operation based on the logic signal in order to operate at the user's voltage supply level. Further, the voltage supply level may be VCC or VDD. Alternatively, the voltage supply level may be VPP. For the integrated circuit, when the voltage supply level is 5 volts, the external pin is connected to ground, and when the voltage supply level is 3 volts, the external pin is connected to the voltage supply level. The voltage level detect circuit may include a logic gate to decode data input at the external pin. The integrated circuit may be a programmable logic integrated circuit. In an embodiment, the external pin is connected only to the voltage level detect circuit of the integrated circuit. The external pin may supply zero current to the integrated circuit. The external pin receives a logic signal. In another embodiment, the external pin supplies less than one milliamp to the integrated circuit. The external pin does not supply the voltage supply level to the internal circuit.

Figure 2:
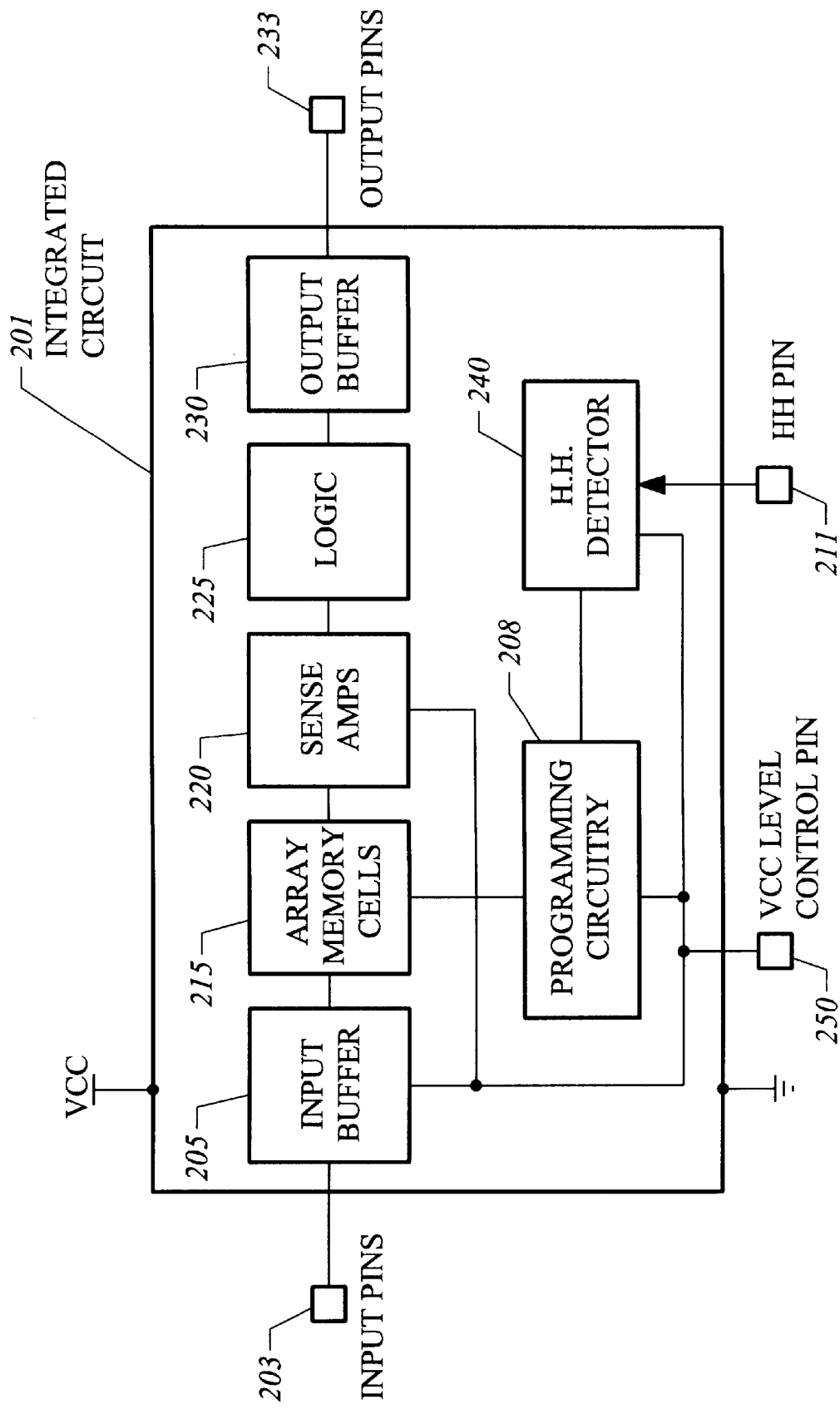
FIG. 2 shows an integrated circuit and its circuit blocks for handling multiple VCC voltage levels.

FIG. 2 shows an integrated circuit 201 of the present invention. This integrated circuit includes EEPROM, EPROM, Flash, or other types memory cells where programming voltages, typically above VCC, are used to configure the cells. In a specific implementation, the nonvolatile memory cells may be floating gate memory cells. There are many types of integrated circuits that have programmable cells including programmable logic devices, field programmable gate arrays, and Flash, EEPROM, or EPROM memories (in serial or parallel format). The programming voltages may be generated on-chip by programming circuitry 208, which may include charge pumps and oscillators, or may be supplied from an off-chip source.

The integrated circuit includes input pins 203 that are connected to an input buffer 205. The input buffer buffers the input and determines whether the input pin is a logic high or logic low. The input buffer connects the an array of memory cells 215, which may be EEPROM, EPROM, Flash, SRAM, DRAM, and others. The memory cells are connected to sense amplifiers 220 to determine the data stored within the memory. The integrated circuit may optionally include logical circuits 225. In a programmable logic integrated circuit, the memory cells are used to configure the logic to implement user-selected logical functions. The sense amps connected to the logic, and the logic to output buffers 230. In some integrated circuits such as a memory integrated circuit, the output of the sense amps may instead be connected directly to an output buffer to output the data stored in the memory array. The outputs buffers output logical data onto output pins 233.

In operation, the integrated circuit is used to implement the user's logical functions or store the user's data using the memory cells. The user uses the integrated circuit in a normal mode and configures the integrated circuit in a configuration or programming mode. The programming circuitry is used to configure the cells, possibly using high voltages. The user can indicate the integrated circuit is to enter the configuration mode by placing an HH voltage, or supervoltage, on the HH pin 211. The supervoltage is higher than the VCC of the integrated circuit. This will ensure the integrated circuit does not enter the configuration mode accidentally or unexpectedly. Entering the configuration mode unexpectedly may cause the integrated circuit to be unintentionally reprogrammed. Therefore, the level of the HH voltage should be high enough above VCC so that glitches or other noise at the HH pin will not accidentally trigger the configuration mode. For example, the HH pin voltage to trigger the configuration mode may be about two volts about VCC. For a VCC of 5 volts, the HH voltage will be 7 volts. For a VCC of 3.3. volts, the HH voltage will be 5.3 volts.

The HH detector circuitry 240 is connected to the programming circuitry 208. When the HH voltage is detected at the HH pin, the HH detector tells the programming circuitry to enter the configuration mode and begin the process of configuring the memory cells. The programming circuitry is connected to the memory cells.

As discussed above, the integrated circuit of the present invention can operate with at various VCC voltage levels. There is a VCC level control pin 250 to indicate what voltage level VCC will be at. With one VCC level control pin, two different VCC levels can be accommodated. If the VCC level control pin is set to a logic high, the user indicates that VCC will be connected to a first supply voltage level, for example, 3.3 volts. And, when the VCC level control pin is set to a logic low, the user indicates VCC will be connected to a second supply voltage level, for example, 5 volts. The VCC level control pin signal is connected to the input buffers, sense amplifiers, programming circuitry, and HH detector circuitry to alter the circuitry in order for the integrated circuit to operate properly at the user's selected VCC voltage.

Although the circuit in FIG. 2 specifically handle two different VCC voltage levels, the circuitry can be modified to accommodate more than two VCC voltage levels. For example, a third VCC voltage level may be handled by adding another buffer like buffer 312 or 318 in parallel between the NOR gate and input pin. In this fashion, any number of VCC voltage levels can be accommodated.

Figure 3:
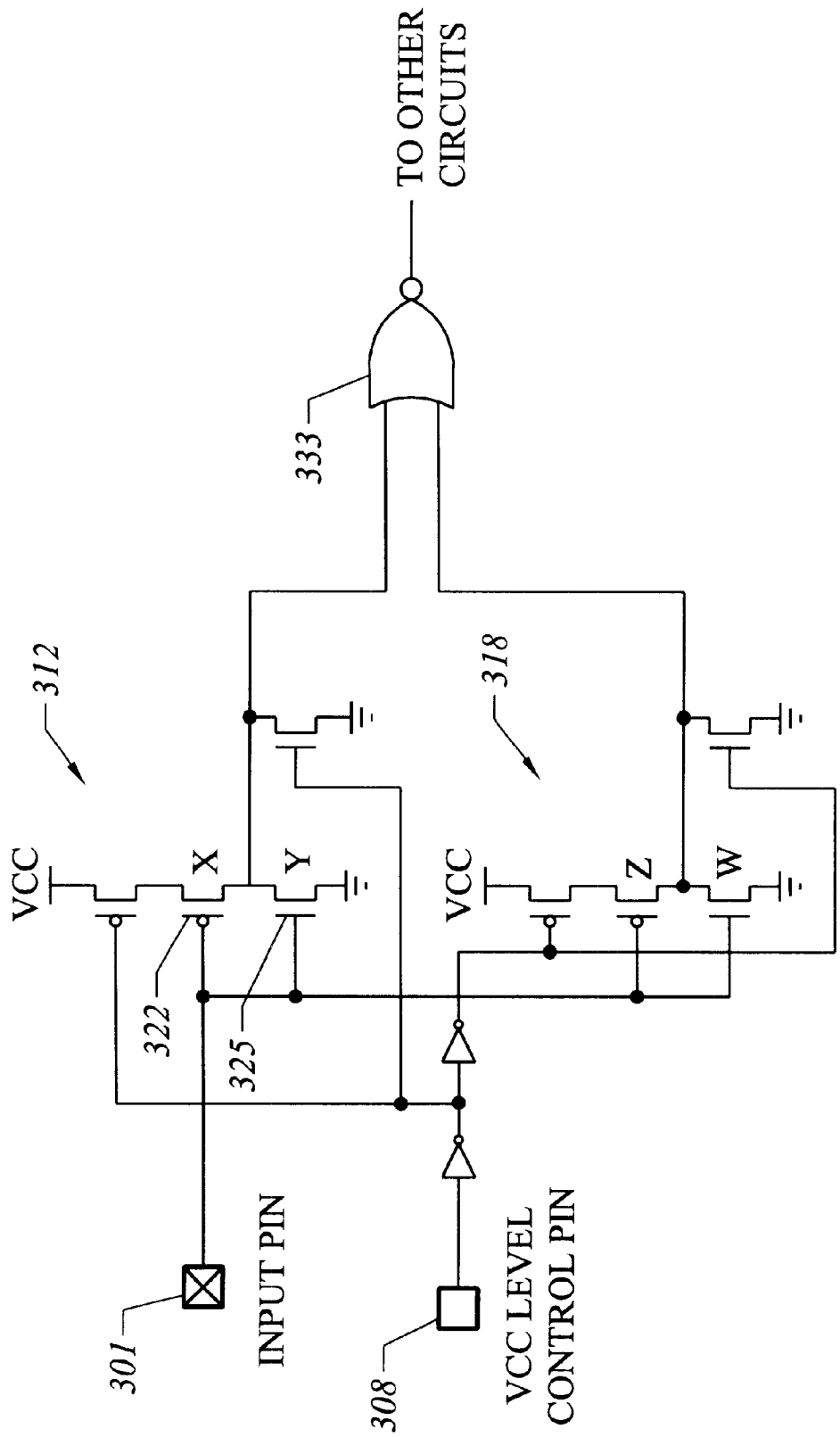
FIG. 3 shows an input buffer for handling multiple VCC voltage levels.

FIG. 3 shows a single input buffer that is capability of operating properly at both first and second VCC levels. An input buffer is designed with a specific input threshold voltage. When VCC changes, in the typical input buffer circuit, the input threshold changes. In FIG. 3, the VCC level control pin or signal 308 is used to select one of two buffers 312 or 318 to be used as input. When the VCC level control signal is high, buffer 312 is selected and when the VCC level control signal is low, buffer 318 is selected. Both buffers 312 and 318 are connected to the same input pin 301. Buffer 312 has an X-sized PMOS transistor 322 and Y-sized NMOS transistor 325. The X/Y ratio of buffer 312 provides a first input threshold voltage. Similarly, for buffer 318, the Z/W ratio provides a second input threshold voltage, different from the first input threshold voltage.

For example, when VCC is 5 volts, the VCC level control signal 308 is low, and buffer 312 is used. Buffer 312 has a X/Y ratio to provide the proper input threshold using a 5-volt supply voltage. Buffer 318 will output a low. A NOR gate 333 will output the input buffer output from buffer 318. The NOR gate may be implemented using pass gates. In the case when VCC is 3.3 volts, buffer 318 with a Z/W ratio is selected and used to provide the input buffer output.

Although the circuit in FIG. 3 specifically handle two different VCC voltage levels, the circuitry can be modified to accommodate more than two VCC voltage levels. For example, a third VCC voltage level may be handled by adding another pull-up device like transistors 422 or 428 in parallel with those transistors. In this fashion, any number of VCC voltage levels can be accommodated by the sense amplifier.

Figure 4:
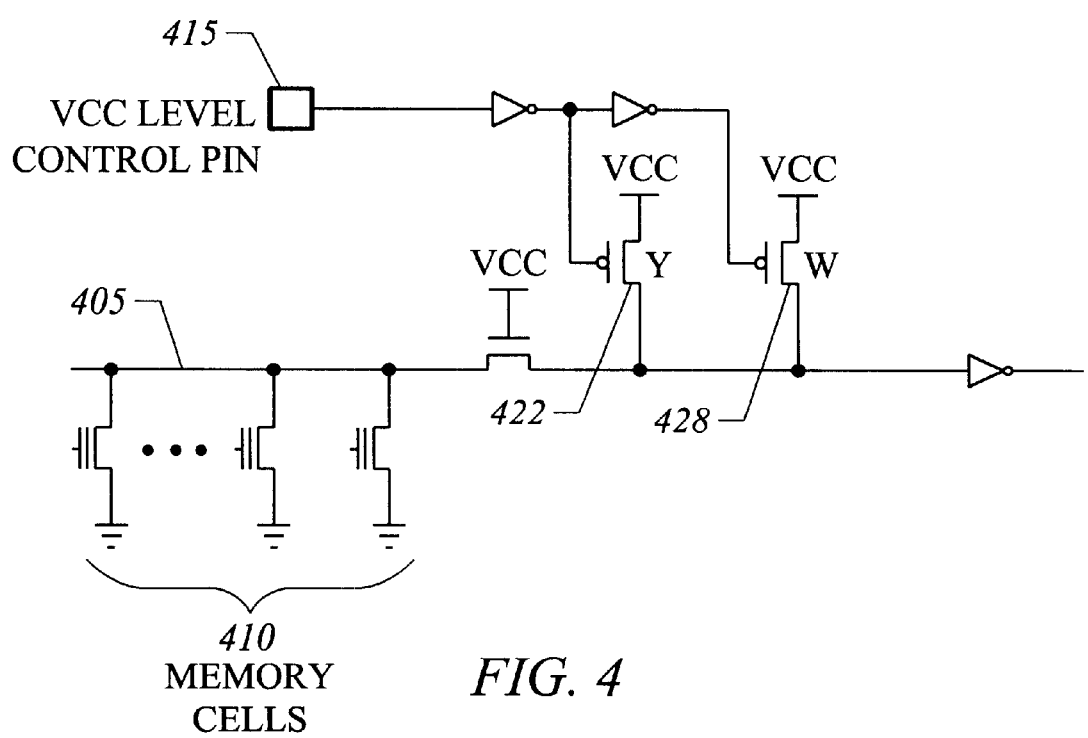
FIG. 4 shows a sense amplifier for handling multiple VCC voltage levels.

FIG. 4 shows a single sense amplifier for a bit line 405 of an array of memory cells 410. This is an abbreviated schematic of the sense amplifier and is used merely to illustrate the principles of the present invention. Depending on the VCC voltage level, the sense amplifier will have a trip point which will vary. The trip point is the voltage level or current level at which the sense amplifier distinguishes between a logic one and logic zero. Therefore, simply by changing the VCC voltage level, the trip point of the sense amplifier may be changed so that the sense amplifier does not operate correctly to determine the stored data in the memory cells. In the invention, the VCC control level signal is connected to enable either one of two pull-up transistors 422 or 428. In this embodiment, transistors 422 and 428 are PMOS devices. But, in other embodiments, these transistors may be NMOS devices.

Transistor 422 is a Y size and transistor 428 is a W size. When VCC is 5 volts, the VCC level control pin is low, and transistor 428 is used as the pull-up of the sense amplifier.

Transistor 422 is turned off. When VCC is 3.3. volts, the VCC level control pin is high, and transistor 422 is used as the pull-up device for the sense amplifier. Transistor 428 will be turned off.

Figure 5:
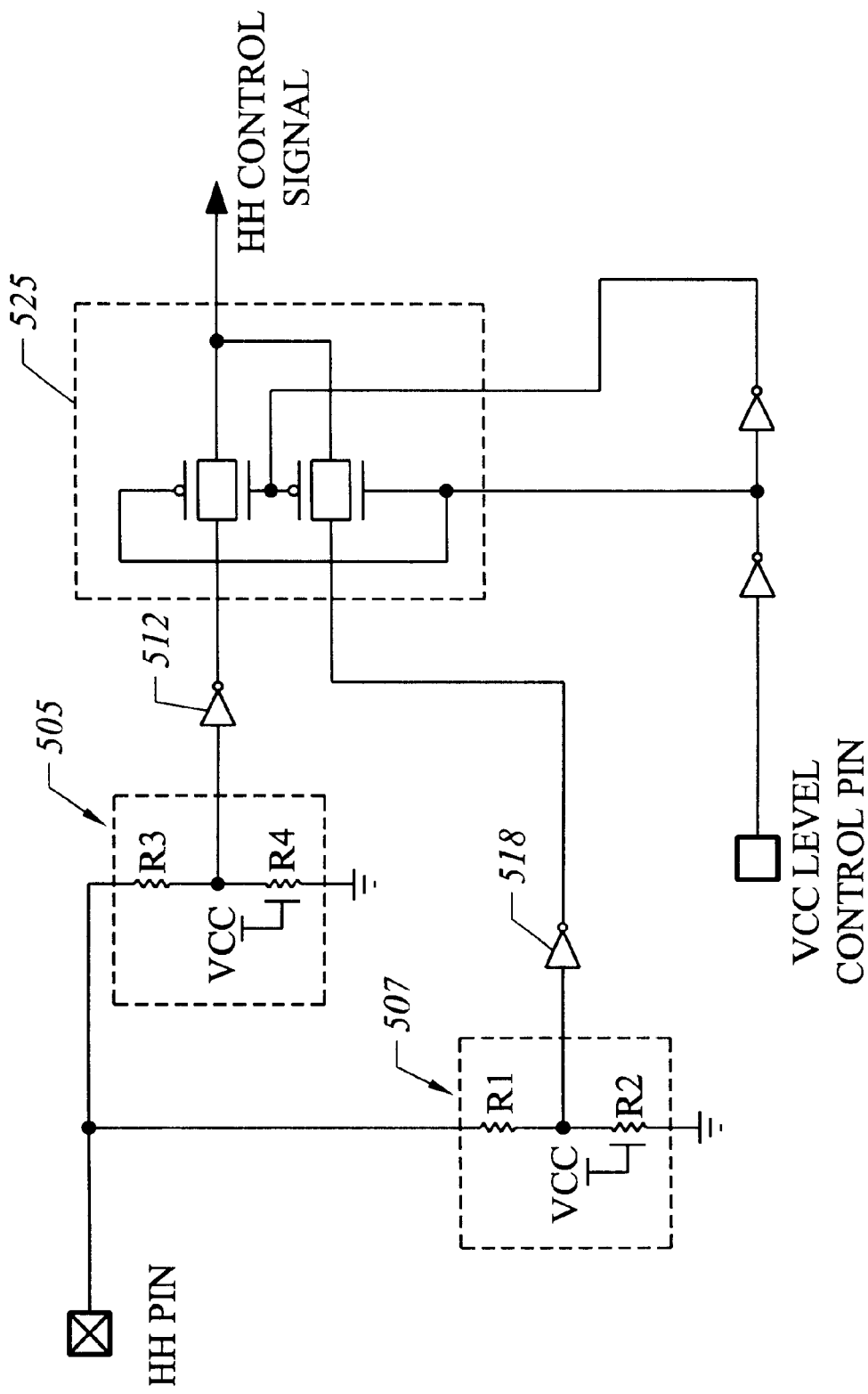
FIG. 5 shows a superhigh voltage detector for handling multiple VCC voltage levels.

FIG. 5 shows a HH voltage detector circuit of the invention which is capable of operating at different VCC voltage levels. As discussed above, depending on what the VCC level is, the HH trigger voltage will also be different. In the circuitry of FIG. 5, the HH pin is connected to two impedance dividers 505 and 507. Impedance divider 505 includes two impedances R3 and R4. The ratio of R3 to R4 sets a threshold and determines when an inverter 512 is trips to indicate the HH voltage is at the HH pin. Similarly, impedance divider 507 includes two impedances R1 and R2. The ratio of R1 to R2 sets a threshold and determines when an inverter 518 trips to indicate the HH voltage is at the HH pin. The ratio of R3/R4 for handling a VCC of 3.3. volts is different than that for R1/R2, which handles a VCC of 5 volts. Impedances R1, R2, R3, and R4 may be formed using resistors, transistors, or other techniques used to obtain impedances within an integrated circuit. In a preferred embodiment, impedances R1, R2, R3, and R4, are formed using transistors with control electrodes to VCC (as shown in FIG. 5).

When VCC is 3.3 volts, the VCC level control signal is high, and a multiplexer 525 passes the output of inverter 512 as the HH control signal. When VCC is 5 volts, the VCC level control signal is low, and the multiplexer passes the output of inverter 518 as the HH control signal. Multiplexer 525 is constructed in this embodiment using pass gates, but may be formed in other embodiments using logic gates or other circuit techniques. When the HH control signal is high, this means that the HH voltage is not at the HH pin. The integrated circuit should be in the normal operation mode. When the HH control signal is low, this means the HH voltage is at the HH pin. The integrated circuit should enter the configuration or programming mode.

Although the circuit in FIG. 5 specifically handle two different VCC voltage levels, the circuitry can be modified to accommodate more than two VCC voltage levels. For example, a third VCC voltage level may be handled by adding another impedance divider circuit like divider 505 or 508 in parallel between the HH pin and a third input to multiplexer 525. In this fashion, any number of VCC voltage levels can be accommodated by the superhigh voltage detect circuit.

Figure 6:
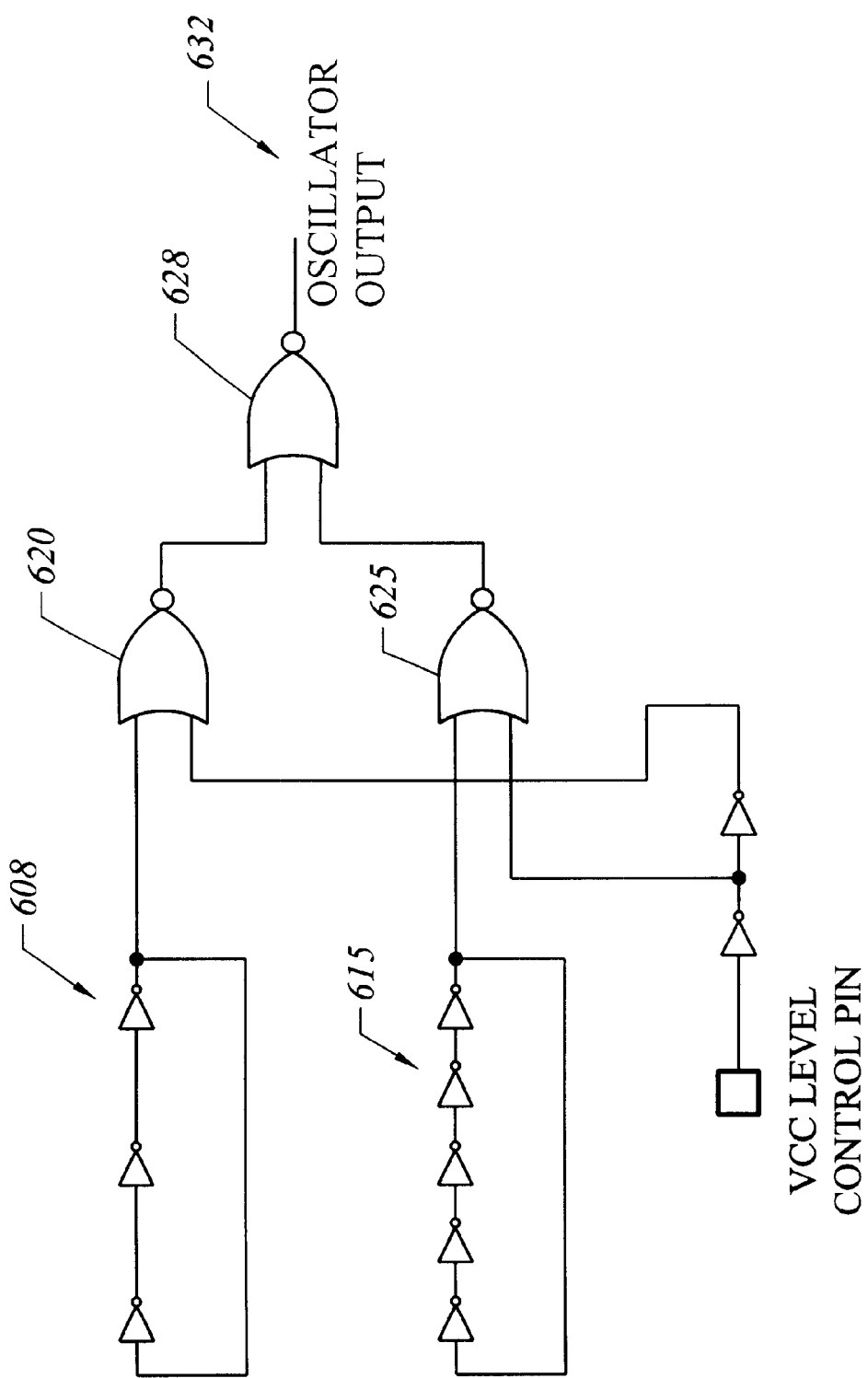
FIG. 6 shows a oscillator for handling multiple VCC voltage levels.

FIG. 6 is a circuit diagram of an oscillator for use in the integrated circuit that operates at various VCC voltages. An oscillator can be used for various purposes in an integrated circuit. The oscillator may be used in the normal operation mode as a clock signal. Or, the oscillator may be part of the programming circuitry and used during the configuration mode to assist in programming the memory cells. In particular, charge pumps may be used to generate on-chip high voltages to program the memory cells. The charge pumps generate the high voltages using a clock or pulse train from the oscillator.

In any application within the integrated circuit, the frequency of the oscillator is important. As the VCC level varies, the frequency of the oscillator will vary. The FIG. 6 circuit provides an oscillator circuit that operates at various VCC levels. There are two ring oscillators 608 and 615 which operate at two different frequencies. For purposes of example, oscillator 608 has three inverters and oscillator 615 has five inverters. Consequently, oscillator 608 should have a higher frequency than oscillator 615. Depending on the VCC control level control signal, either the output of oscillator 608 or 615 will be output through NOR gates 620, 625, 628 to an oscillator output 632. The logic implemented by the NOR gates may be implemented using other logical approaches, including using pass gates, multiplexes, logic gates with more than two inputs, NAND gates, AND gates, inverters, and others. By using the circuitry in FIG. 6, an appropriate oscillator having an appropriate oscillator frequency is selected depending on the VCC voltage level.

For example, when VCC is 5 volts, the VCC level control signal is low, and oscillator 608 is selected to output to oscillator output 632. When VCC is 3.3 volts, the VCC level control signal is high, and oscillator 615 is selected to output to the oscillator output.

Although the circuit in FIG. 6 specifically handle two different VCC voltage levels, the circuitry can be modified to accommodate more than two VCC voltage levels. For example, a third VCC voltage level may be handled by adding another oscillator like oscillator 608 or 615 in parallel between the NOR gate and nput pin. In this fashion, any number of VCC voltage levels can be accommodated.

Note that in the implementation of the invention FIG. 2, the output buffer circuit does not change depending on the on the VCC level. The output buffer circuitry will output a logic high at about the VCC level and an logic low at about the ground or VSS level. In other implementations, the output buffer may use RAM bits to control the size or sizes of the pull-up device used to pull-up the output pad. However, in order to load RAM bits into the integrated circuit, the input buffer must be have been preconfigured with the correct input buffer threshold for the VCC level.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. It is intended that the scope of the invention be defined by the following claims.

What is claimed is:

1. An integrated circuit comprising
an external pin;
a voltage level detect circuit, coupled to receive a logical input signal from the external pin and based on the logical input signal, the voltage level detect circuit outputs a logical output signal indicative of a voltage supply level provided to the integrated circuit by a user; and
an internal circuit coupled to receive the logical output signal, wherein the internal circuit modifies its operation based on the logical output signal in order to operate at the user's voltage supply level.

2. The integrated circuit of claim 1 wherein the voltage supply level is VCC or VDD.

3. The integrated circuit of claim 1 wherein the voltage supply level is VPP.

4. The integrated circuit of claim 1 wherein the integrated circuit is a programmable logic integrated circuit.

5. The integrated circuit of claim 1 wherein the external pin supplies zero current to the integrated circuit.

6. The integrated circuit of claim 1 wherein the external pin supplies less than one milliamp to the integrated circuit.

7. The integrated circuit of claim 1 wherein the external pin does not supply the voltage supply level to the internal circuit.

8. An integrated circuit comprising
an external pin;
a voltage level detect circuit coupled to the external pin, wherein the voltage level detect circuit outputs a logic signal indicative of a voltage supply level provided to the integrated circuit by a user; and
an internal circuit coupled to receive the logic signal, wherein the internal circuit modifies its operation based on the logic signal in order to operate at the user's voltage supply level, and when the voltage supply level is 5 volts, the external pin is coupled to ground, and when the voltage supply level is 3 volts, the external pin is coupled to the voltage supply level.

9. An integrated circuit comprising
an external pin;
a voltage level detect circuit coupled to the external pin, wherein the voltage level detect circuit outputs a logic signal indicative of a voltage supply level provided to the integrated circuit by a user; and
an internal circuit coupled to receive the logic signal, wherein the internal circuit modifies its operation based on the logic signal in order to operate at the user's voltage supply level, and the voltage level detect circuit comprises a logic gate to decode data input at the external pin.

10. The integrated circuit of claim 9 wherein the voltage supply level is VCC or VDD.

11. The integrated circuit of claim 9 wherein the voltage supply level is VPP.

12. The integrated circuit of claim 9 wherein when the voltage supply level is at a first level, the external pin is coupled to ground, and when the voltage supply level is at a second level, the external pin in coupled to the voltage supply level.

13. The integrated circuit of claim 9 wherein the integrated circuit is a programmable logic integrated circuit.

14. The integrated circuit of claim 9 wherein the external pin supplies zero current to the integrated circuit.

15. The integrated circuit of claim 9 wherein the external pin receives a logic signal.

16. The integrated circuit of claim 9 wherein the external pin supplies less than one milliamp to the integrated circuit.

17. The integrated circuit of claim 9 wherein the external pin does not supply the voltage supply level to the internal circuit.

18. An integrated circuit comprising
an external pin;
a voltage level detect circuit coupled to the external pin, wherein the voltage level detect circuit outputs a logic signal indicative of a voltage supply level provided to the integrated circuit by a user; and
an internal circuit coupled to receive the logic signal, wherein the internal circuit modifies its operation based on the logic signal in order to operate at the user's voltage supply level, and the external pin is coupled only to the voltage level detect circuit of the integrated circuit.

19. A programmable integrated circuit comprising:
a VCC level control pin;
a plurality of input buffers, each coupled to the VCC level control pin;
a plurality of memory cells coupled to the input buffers; and
a plurality of sense amplifiers coupled to the memory cells and the VCC level control pin, wherein the input buffers and sense amplifiers are configured to operate with one of at least two different VCC voltage levels based on a logic level at the VCC level control pin.

20. The programmable integrated circuit of claim 19 wherein the memory cells comprise nonvolatile floating gate transistors.

21. The programmable integrated circuit of claim 19 further comprising:
programming circuitry, coupled to the memory cells and the VCC level control pin.

22. The programmable integrated circuit of claim 21 wherein the programming circuitry comprises an oscillator circuit comprising:
a first oscillator having a first oscillator frequency;
a second oscillator having a second oscillator frequency, different from the first oscillator frequency;
a first logic gate coupled to the first oscillator and a signal from the VCC level control pin;
a second logic gate coupled to the second oscillator and an inverted version of the signal from the VCC level control pin; and
a third logic gate coupled to the first and second logic gates and providing an oscillator output.

23. The programmable integrated circuit of claim 21 further comprising:
a superhigh voltage detector coupled to the programming circuitry, the VCC level control pin, and a superhigh voltage pin.

24. The programmable integrated circuit of claim 23 wherein the superhigh voltage detector circuit comprises:
a first impedance divider circuit having a first ratio coupled to the superhigh voltage pin;
a second impedance divider circuit having a second ratio, different from the first ratio, coupled to the superhigh voltage pin; and
a multiplexer circuit coupled to the first and second impedance divider circuits, wherein a selection input of the multiplexer is coupled to a signal from the VCC level control pin and the multiplexer outputs a superhigh voltage control signal.

25. The programmable integrated circuit of claim 19 further comprising:
logic circuitry, coupled to the sense amplifiers; and
a plurality of output buffers, coupled to the logic circuitry.

26. The programmable integrated circuit of claim 19 wherein an input buffer comprises:
a first buffer comprising:
a first transistor coupled to a VCC supply;
a second transistor coupled between the first transistor and a first buffer output node; and
a third transistor coupled between the first buffer output node and a ground supply, wherein control electrodes of the second and third transistors are coupled to an input pin and sizes of the second to third transistor have a first ratio;
a second buffer comprising:
a fourth transistor coupled to the VCC supply;
a fifth transistor coupled between the fourth transistor and a second buffer output node; and
a sixth transistor coupled between the second buffer output node and the ground supply, wherein control electrodes of the fifth and sixth transistors are coupled to an input pin and sizes of the fifth to sixth transistor have a second ratio, different from the first ratio; and a logic gate circuit coupled to the first and second buffer outputs and providing an input buffer output, wherein a control electrode of the first transistor is coupled to a signal from the VCC level control pin and a control electrode of the fourth transistor is coupled to an inverted version of the signal from the VCC level control pin.

27. The programmable integrated circuit of claim 19 wherein a sense amplifier comprises:

a bit line coupled to a plurality of memory cells, coupled in parallel;

a first pull-up transistor coupled to the bit line and having a first size; and a second pull-up transistor coupled to the bit line and having a second size, different from the first size, wherein a control electrode of the first pull-up transistor is coupled to a signal from the VCC level control pin and a control electrode of the second pull-up transistor is coupled to an inverted version of the signal from the VCC level control pin.

28. The programmable integrated circuit of claim 19 wherein the integrated circuit is a programmable logic device.

29. A programmable logic integrated circuit comprising:

a VCC level control pin;

a plurality of input buffers, each having an adjustable input threshold voltage which is varied based on a signal from the VCC level control pin;

a plurality of memory cells coupled to the input buffers;

a plurality of sense amplifiers coupled to the memory cells, wherein each sense amplifier has an adjustable trip point which is varied based on the signal from the VCC level control pin;

a plurality of configurable logic circuits, coupled to the sense amplifiers, programmable by a user to implement logical functions; and programming circuitry coupled to the sense memory cells comprising an oscillator circuit having an adjustable oscillator frequency which is varied based on the signal from the VCC level control pin.

30. The programmable logic integrated circuit of claim 29 wherein the VCC level control pin indicates a VCC level of the integrated circuit is one of at least two different VCC levels.

31. The programmable logic integrated circuit of claim 29 wherein there are two or more VCC level control pins.

32. The programmable logic integrated circuit of claim 29 wherein the memory cells comprise Flash transistors.

33. An integrated circuit comprising an external pin;

a voltage level detect circuit coupled to the external pin, wherein the voltage level detect circuit outputs a logic signal indicative of a voltage supply level provided to the integrated circuit by a user; and an internal circuit coupled to receive the logic signal, wherein the internal circuit modifies its operation based on the logic signal in order to operate at the user's voltage supply level, and when the voltage supply level is at a first level, the external pin is coupled to ground, and when the voltage supply level is at a second level, the external pin is coupled to the voltage supply level.

34. The integrated circuit of claim 33 wherein the voltage supply level is VCC or VDD.

35. The integrated circuit of claim 33 wherein the voltage supply level is VPP.

36. The integrated circuit of claim 33 wherein the integrated circuit is a programmable logic integrated circuit.

37. The integrated circuit of claim 33 wherein the external pin is coupled only to the voltage level detect circuit of the integrated circuit.

38. The integrated circuit of claim 33 wherein the external pin supplies zero current to the integrated circuit.

39. The integrated circuit of claim 33 wherein the external pin receives a logic signal.

40. The integrated circuit of claim 33 wherein the external pin supplies less than one milliamp to the integrated circuit.

41. The integrated circuit of claim 33 wherein the external pin does not supply the voltage supply level to the internal circuit.

* * * * *